United States Patent
Laukala et al.

(10) Patent No.: US 7,809,533 B2
(45) Date of Patent: Oct. 5, 2010

(54) COMPUTER AIDED MODELING

(75) Inventors: Juha Laukala, Espoo (FI); Kari Sydänmaanlakka, Helsinki (FI); Ragnar Wessman, Espoo (FI); Jukka Suomi, Espoo (FI); Jukka Partanen, Espoo (FI); Jukka Kainulainen, Espoo (FI)

(73) Assignee: Tekla Corporation, Espoo (FI)

( * ) Notice: Subject to any disclaimer, the term of this patent is extended or adjusted under 35 U.S.C. 154(b) by 636 days.

(21) Appl. No.: 11/731,000

(22) Filed: Apr. 5, 2007

(65) Prior Publication Data

US 2008/0189084 A1    Aug. 7, 2008

(30) Foreign Application Priority Data

Feb. 6, 2007    (FI)    ................... 20075084

(51) Int. Cl.
    *G06F 17/10*    (2006.01)
(52) U.S. Cl. ............................................. 703/2; 703/1
(58) Field of Classification Search ............ 703/1, 703/2; 717/120, 122; 715/764, 765
See application file for complete search history.

(56) References Cited

U.S. PATENT DOCUMENTS

| | | | |
|---|---|---|---|
| 2002/0107673 A1* | 8/2002 | Haller et al. | 703/1 |
| 2002/0183878 A1* | 12/2002 | Chartier et al. | 700/98 |
| 2004/0249809 A1* | 12/2004 | Ramani et al. | 707/4 |
| 2006/0117012 A1* | 6/2006 | Rizzolo et al. | 707/9 |
| 2006/0250418 A1* | 11/2006 | Chartier et al. | 345/619 |

OTHER PUBLICATIONS

Xuexi et al., Q. A 3D Integral Data Model for Subsurface Entities Based on Extended GTP. IEEE International Conference on Geoscience and Remote Sensing Symposium, Jul.-Aug. 2006, pp. 1519-1522.*

* cited by examiner

*Primary Examiner*—Russell Frejd
(74) *Attorney, Agent, or Firm*—Young & Thompson

(57) ABSTRACT

Different designers of a structure exchange information on their plans (models) with each other. This information is exchanged by reference data which may be in another format than what the designer's application is using. To facilitate a designer to maintain correspondence between his/her model and models handled by different designers, when the reference data is read and an entity is recognized in the data, geometric characteristics of the entity are calculated, and an identifier is formed for the entity by means of the geometric characteristics. The identifier is stored in the model, and it can be used to identify the entity as long as the entity remains unchanged although reference data is updated.

18 Claims, 3 Drawing Sheets

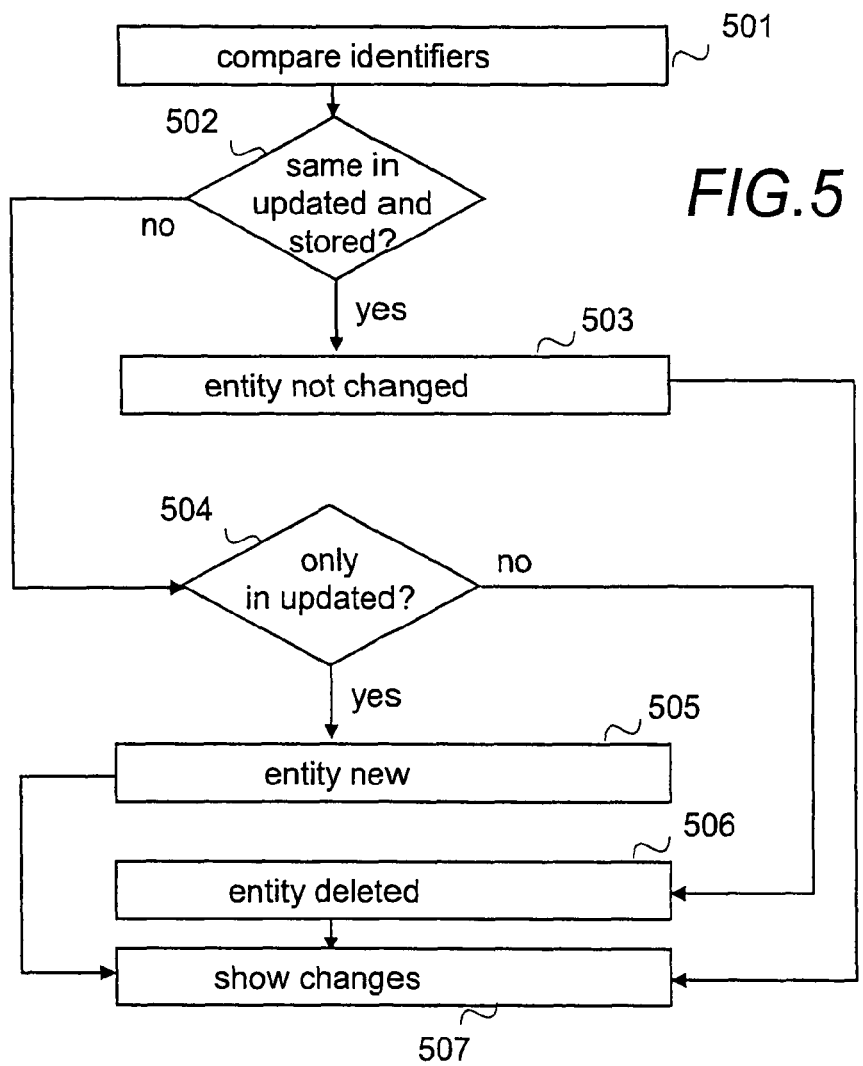

COMPUTER AIDED MODELING

FIELD OF THE INVENTION

The invention relates to computer-aided modeling and particularly to identifying entities read into a model from a data file containing entity information in another format than the one used in the model.

BACKGROUND OF THE INVENTION

Modeling means that a model is created from an object under design for describing the object to be manufactured. The development of data processing systems and computers has transformed modeling into a computerized process, where a product model is created from the object. For example, the product model of a building is an entity consisting of the product data on the life span of the building and building process. Computer applications describe the real-world building elements of the building using building element entities that are processed by the applications. The product model of a building may be stored as a database of a computer application or as a file.

Typically several designers using different applications are involved in a modeling process of a building, such as architects, structural engineers and HVAC (heating, ventilation and air conditioning) engineers, each maintaining their own model, which is a part of a product model of a building. Thanks to the need for model information exchange between these different designers and the fact that modeling of a building by different designers is more and more overlapping in time, most of the applications support external models, also called as reference models. In other words, data transfer between different computer applications by means of a transfer file has been evolved. Entities representing modeled objects in the transfer file may be in a format of a computer application used to create the entities, in another format supported by the computer application (i.e. data can be rewritten to the format), examples of the format including DWG and DGN, or in a common standard format, such as IFC. With the means of the transfer files, a designer can refer to a model created by another and see the geometry in that model in the designer's model. These transfer files are typically read into the model of another designer several times, since the overlapping designing means that a structural engineer does not receive the final architect's plan but several drafts of it, for example, and updated transfer files replacing earlier transfer files need to be read into a model for maintaining correspondence between models handled by different designers. For example, an architect has modeled, using a first modeling application, a wall with a door, and stores the wall and the door in a transfer file. Then the structural engineer's modeling application, which is not the same as the first one, reads the transfer file into the structural engineer's model, which then shows the wall and the door. On the basis of that, the structural engineer creates his own model for the wall with a door opening for structural planning, using the transfer file as a reference model. Then the structural engineer receives an updated transfer file from the architect, in which a window is added to the wall. A problem with this is that since there is no reliable mechanism to transmit identifiers in a transfer file, the transfer file is always read as a new file, i.e. each entity is regarded as a new one. Referring to the above example, when the transfer file is read into the model, a new opening is detected but the wall and the door are also read into the model as new entities, and the structural engineer has to detect himself which entities in the reference model are actually new entities, and if the structural engineer has referred to the door in his/her model, he/she has to make that reference again (since the door is "new").

SUMMARY

The invention relates to a method, a program product and an apparatus which are characterized by what is stated in the independent claims. The preferred embodiments are disclosed in the dependent claims.

A general aspect is based on the idea of calculating geometric characteristics of an entity read into a model in a first format and using the geometric characteristics to form an identifier for the entity in the model, the model using a second format. Herein, an entity means a graphical entity containing a set of graphic primitives belonging together.

An advantage of the invention is that since geometric characteristics of an unchanged entity remain the same, they can be used to identify the entity as long as the entity remains unchanged although a reference model is updated, regardless of the formats used in the reference model and in the model into which the reference model is read. Thanks to that, an already read entity may be identified and recognized as a read one when a next version of a transfer file is read into a model, thereby enabling information relating to the entity to be stored in the model so that the information endures and can be linked to the entity also after the next version is read into the model.

BRIEF DESCRIPTION OF THE DRAWINGS

In the following different embodiments of the invention will be described in greater detail with reference to the attached drawings, in which

FIGS. 5 and 6 are flow charts illustrating how geometric characteristics may be utilized.

DETAILED DESCRIPTION OF SOME EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment.

The present invention is applicable to any computer-aided modeling system which can read into a model from a transfer file data in another format than the one used in the model. Herein, "reading data into a model" covers both using the data as a reference data, i.e. data external to the model, and integrating data to the model, i.e. becoming part of the model definitions.

In the following, the invention will be described by using an exemplary system where the program of the invention is run in a personal computer by utilizing a run-time database comprising information to be stored and already stored in a disc memory of the computer on the entire object modeled/to be modeled, for instance a building, without restricting the invention thereto. In another embodiment of the invention, an object-oriented database or a relation database, for example, can be utilized and used over a network from one or more terminals, for instance. Various programming techniques, storage of data in memory and manners of implementing databases develop constantly. This may require extra changes in the invention. Consequently, all terms and expressions should be interpreted broadly, and they are intended to describe, not to restrict, the invention.

Figure 1:
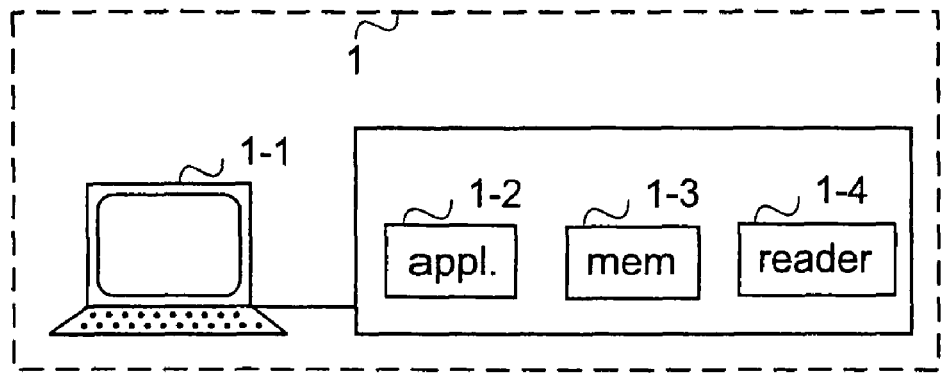
FIG. 1 is a simplified block diagram illustrating the architecture of a system used as an example.

FIG. 1 illustrates a simplified modeling system describing only the essential parts of the logical units of the system whose implementation may deviate from what is presented. It is obvious to a person skilled in the art that the system may also comprise other functions and structures that need not be described in greater detail here. The more detailed structure of the system is irrelevant to the actual invention.

The modeling system 1 illustrated in FIG. 1 comprises a personal computer with a user interface 11, an application module 12 according to an embodiment, memory 13 and reading means 14 for reading the content of a transfer file into a model.

The user interface 11 is the interface of the user, i.e. the person processing the model, to the modeling system. The user can create a model, modify a model, study it, print desired figures and reports of it, see the reference model read into the user's model, input information to the model, etc. However, details of the manner of inputting information into the modeling system are irrelevant to the invention, and therefore are not described in detail here.

The memory 13 comprises, for example, program snippets defined as part of a program, which constitute "program libraries", and data stored/to be stored during modeling, such as object definitions and identifiers of read entities, based on their geometric characteristics, and possible further information relating to a read entity and attached to a corresponding entity identifier. In the exemplary system, data are stored in the memory in a file, for instance, and during processing the data constitute a "run-time database" in the central memory where they are read from a disk memory and where they can be processed faster. When the processing ends, the run-time data of the database, or at least the modified data, are stored in the disk memory. It is obvious to a person skilled in the art that data can be stored in one or more files and/or they can be stored/processed in another form and/or by using other memories.

Reading means 14 are configured to read a content of a transfer file. If a transfer file is stored on a disk, the reading means comprises a hard disk drive with a reading head, and if a transfer file is obtained via email, Internet or over some other communication, the reading means comprise an interface enabling the reading. However, details of the manner of reading data, such as a reference data, into the modeling system are irrelevant to the invention, and therefore are not described in detail here.

Although the personal computer depicting an apparatus according to an embodiment has been depicted as one unity, different modules and memory may be implemented in one or more physical or logical unities. Different embodiments of such an apparatus, or more precisely, different examples of a functionality of the application module 12 are described in more detail below.

It should be appreciated that the apparatus may comprise other modules used in or for modeling. However, they are irrelevant to the actual invention and, therefore, they need not to be discussed in more detail here.

Apparatuses, such as personal computers and/or other corresponding devices or apparatuses implementing the functionality of a corresponding apparatus described with an embodiment, comprise not only prior art means, but also means for calculating geometric characteristics for an entity, means for forming an identifier for an entity by the means of geometric characteristics, and means for storing the identifier. In addition, they may comprise means for determining changed and/or deleted entities, for example. More precisely, they comprise means for implementing functionality of a corresponding apparatus described with an embodiment and they may comprise separate means for each separate function, or means may be configured to perform two or more functions. Present apparatuses comprise processors and memory that can be utilized in an embodiment. For example, the application module 12 may be a software application, or a module configured as an arithmetic operation, or as a program (added or updated software routines), executed by an operation processor. Software routines, also called program products, including applets and macros, can be stored in any apparatus-readable data storage medium and they include program instructions to perform particular tasks. Thus, the apparatus may be configured as a computer including at least a memory for providing storage area used for arithmetic operation and an operation processor, such as a central processing unit (CPU), for executing the arithmetic operation. Further, software routines may be downloaded into an apparatus and the memory may be a removable memory detachably connected to the apparatus.

The modeling system illustrated in FIG. 1 represents the simplest modeling system. In larger modeling systems, the user interface may be a terminal and the memory a database with which the terminal communicates via a server. The server performs functions of the application module of the exemplary system, or at least some of them, allowing also the terminal to carry out functions of the application module of the exemplary system. There may be one or several networks between the terminal and the server. They may comprise several terminals and servers with databases, which are preferably integrated, to be visible to the modeler as one database and one database server. Whether the functions of the system to be described in the following are performed in a terminal, in a database server or so that some of them are performed in a terminal and some in a database server, i.e. the location where the data read into a model is processed, is irrelevant to the invention.

In the following, embodiments are described by means of examples in which geometrical characteristics form an identifier and a transfer file is used as a file containing reference data, i.e. as data which may be used as aid but which do not come part of the model it is read into, without restricting the invention to such a solution, however.

Figure 2:
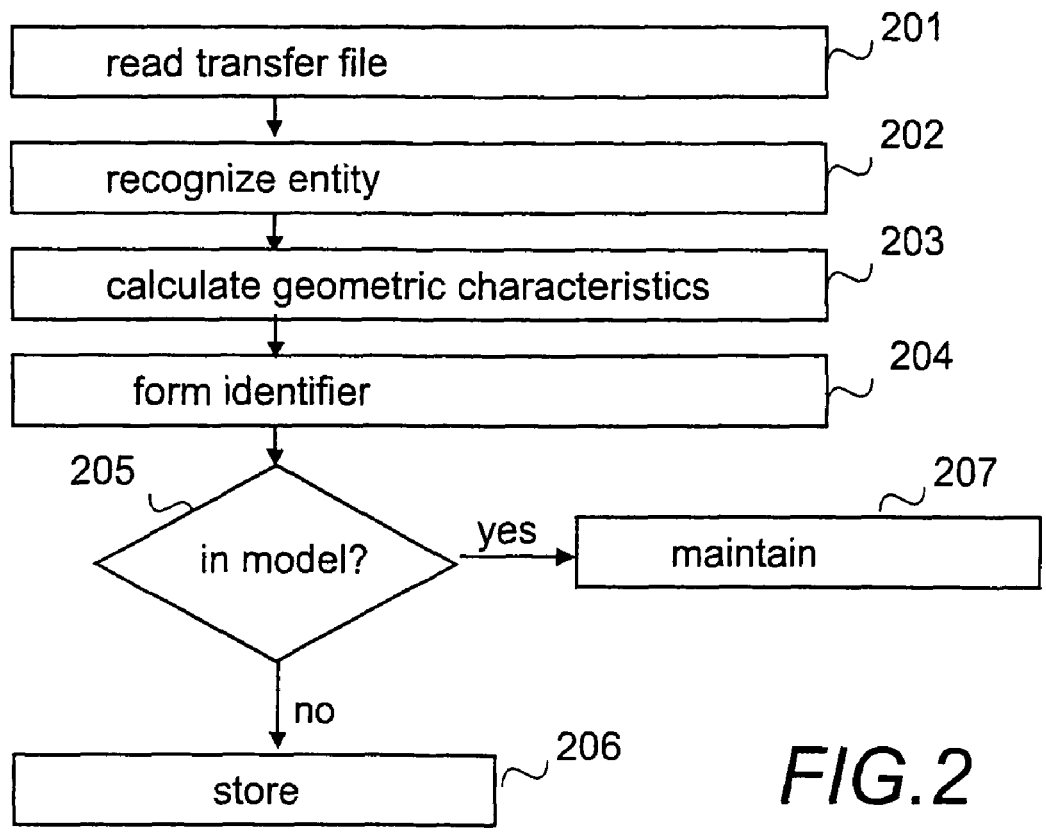
FIG. 2 is a flow chart of a read functionality according to an embodiment.

FIG. 2 is a flow chart illustrating the reading functionality of the mechanism according to an embodiment. During reading (step 201) of a new or updated version of data into a model by means of a transfer file, an entity is recognized in step 202. An entity may be recognized on the basis of an indicator or because lines unite, for example. In response to recognizing an entity, geometric characteristics of the entity are calculated, in step 203, according to a predefined set of calculation rules, an example of which will be described below. These calculated geometric characteristics are then used, in step 204, to form an identifier. Then it is checked, in step 205, whether or not the model already contains the identifier, i.e. an entity with the same geometric characteristics. If not, the entity is a new one, or an amended entity regarded as a new one, and the identifier is stored, in step 206, in the model. If the model already contains the identifier (step 205), the existing information is maintained in step 207.

In an embodiment, information on model versions is maintained, including entity version information on when the identifier was first time stored and/or when the entity was last time read into the model. In the embodiment, the entity version information is updated (i.e. in step 206 or in step 207).

It should be appreciated that "the same geometric characteristics" means that they are the same within a certain range, such as epsilon in the floating point number calculation.

Figure 3:
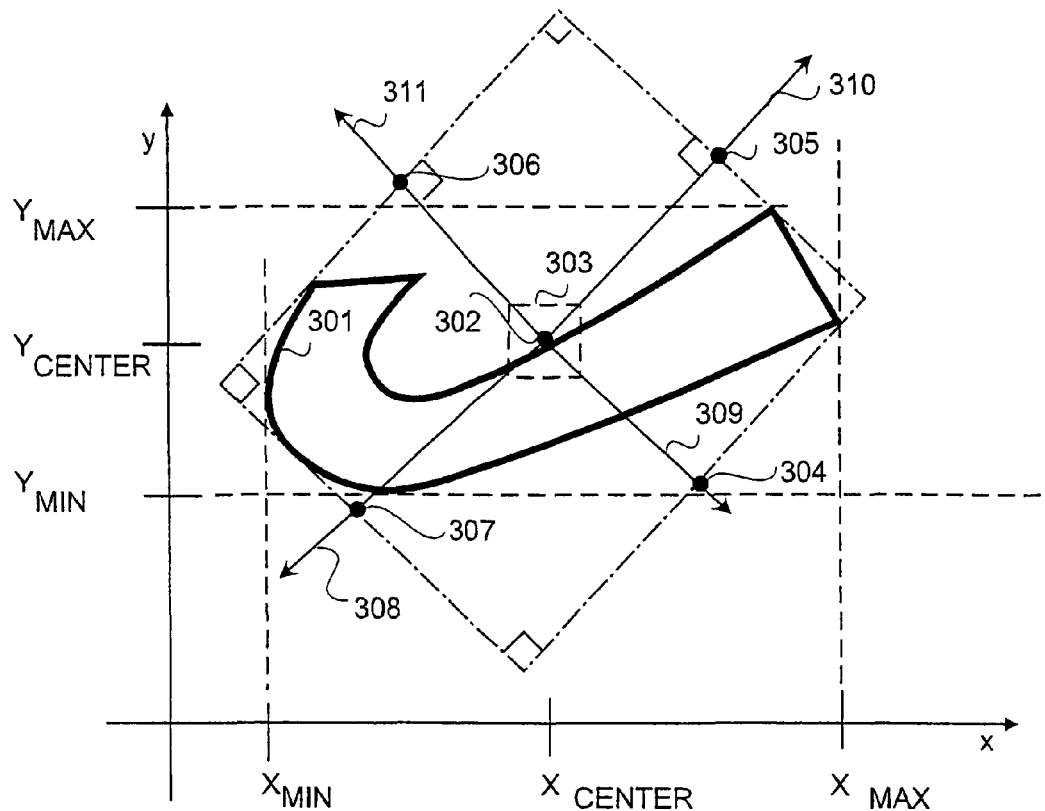
FIGS. 3 and 4 illustrate calculating geometric characteristics according to an embodiment.
Figure 4:
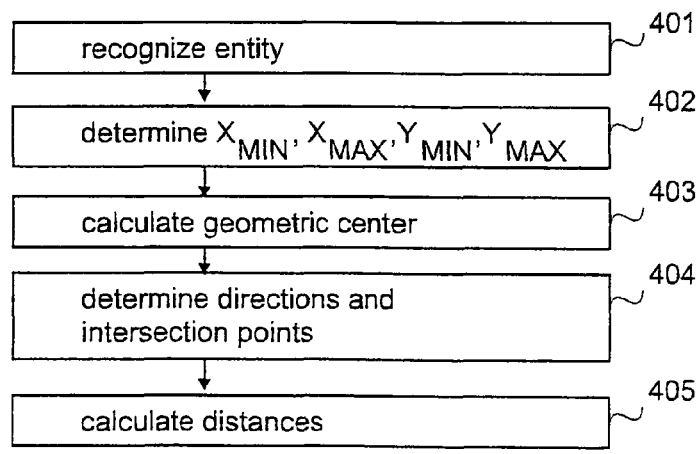

FIGS. 3 and 4 illustrate calculating geometric characteristics of an entity according to an embodiment in which the geometric characteristics are a geometric center and cross-angle distances. For the sake of clarity, the embodiment is illustrated using a 2-D entity.

Referring to FIG. 3, in addition to an entity 301, also its minimum and maximum coordinates $X_{MIN}$, $X_{MAX}$, $Y_{MIN}$ and $Y_{MAX}$ are needed for calculating the geometric center 302 of the entity, coordinates for the geometric center being $X_{CENTER}$, $Y_{CENTER}$. For determining directions for cross-angle distances, a unit square 303 is placed so that the geometric center of the unit square is the same as the geometric center of the entity and the sides are parallel with one of the coordinate axes (and perpendicular to the other). A unit square is a rectangle with each side length being 1. In the illustrated embodiment, a bounding area of the entity is calculated for determining maximum distances in different directions, the bounding area being a bounding box (rectangular box) aligned with the directions. The distances are calculated from the geometric center of the entity to intersection points 304, 305, 306, 307, where lines 308, 309, 310, 311 originating from the center in the directions defined by the corners of the unit square intersect with the bounding area.

In other embodiments of the invention, the bounding area may be of another type, such as a circle, or a polygon having no predetermined shape and having as many sides as the shape of the outer surface of the entity requires, and/or an arbitrary oriented bounding box, such as a rectangular box with a minimum area inside which the entity will fit. In an embodiment, no bounding area is calculated but instead the surface of the entity is used, the surface being preferably an outer surface. In the last embodiment, a situation may arise where there is no surface crossing a line from the center in a direction, and there are several ways to handle the situation. For example, a negative distance to the closest cross-point in the counter-direction may be calculated and used as one of the distances, or a zero may be used.

FIG. 4 is a flow chart illustrating how geometric characteristics are calculated using the entity in FIG. 3 with its bounding area as an example and having as one calculation rule that one distance is calculated for one direction, the distance being calculated to the outermost cross point. When an entity is recognized (step 401), its minimum and maximum coordinates $X_{MIN}$, $X_{MAX}$, $Y_{MIN}$ and $Y_{MAX}$ are determined in step 402, and coordinates ($X_{CENTER}$, $Y_{CENTER}$) of a geometric center are calculated in step 403 using the following formulas:

$$X_{CENTER}=(X_{MIN}+X_{MAX})/2$$

$$Y_{CENTER}=(X_{MIN}+X_{MAX})/2$$

After that, the unit square is placed, in step 404, as described above, and the directions and intersection points are determined, in step 405, by means of a bounding area calculated for the entity. Then the distances are calculated in step 406. In the example illustrated, the following four distances will be calculated: distance one between points 302 and 304, distance two between points 302 and 305, distance three between points 302 and 306, and distance four between points 302 and 307 of FIG. 3.

After the geometric center and the distances have been calculated, they are stored in the run-time database, for example, according to a predefined rule as an identifier of the entity. In other words, the identifier is formed by means of the geometric characteristics. The identifier may be in a form "geometric center, distance one, distance two, distance three, distance four". Forming the identifier directly from the geometric characteristics has the advantage that information processing is minimized. However, the identifier may be formed in another way, an example being calculating a hash from the geometric characteristics and using the hash as the identifier.

A similar method may be implemented to calculate geometric characteristics of entities in a 3-dimensional model, wherein x, y and z coordinates are used to calculate the center of the entity, and a unit cube, or more precisely, corners of a unit cube, is used for determining the directions, and a cuboid, a polyhedron, a bounding sphere, or a cylinder, for example, is used to determine a bounding volume having intersections with "direction lines" so that altogether 8 distances are calculated for an entity. (A unit cube is a cube whose length of side is 1, and a cuboid is a solid figure bounded by six rectangular faces, all angles are right angles, and opposite faces of a cuboid are equal.)

In an embodiment, if a transfer file containing 2-dimensional information on entities is read into a 3-dimensional model, the 2-dimensional information is changed into 3-dimensional by giving a value for the missing one of the x, y and z coordinates of the entities. Depending on an implementation, the value may be a zero and provided automatically, i.e. without user interaction, or the value may be asked from a designer.

In another embodiment, the application is configured to, in response to 2-dimensional information, use the unit square and related rules, and in response to 3-dimensional information, use the unit cube and related rules. Further, the application may be configured to use some predetermined value, such as a zero or a character, so that a 2-dimensional entity has as many geometric characteristics as a 3-dimensional entity, if the implementation requires the same number of geometric characteristics.

It should be appreciated that the above is only an example how to determine and calculate geometric characteristics. In other embodiments, another mechanism than a unit square/unit cube with its corners can be used to determine directions, and the directions may be different from the described ones, it suffices that the mechanism allows determining directions in the same way each time an entity is read into a model. Further, another number of distances may be calculated. For example, in addition to the described four distances, also distances from the geometric center to intersections in a direction parallel to y-axis and/or x-axis may be calculated. Yet another example relates to a situation in which no bounding area/volume is calculated for an entity but the surface of the entity is used, and the entity has several intersections in one direction. Such an entity may be a comb-shaped entity placed so that in the north-east direction there are ten intersections. Depending on definitions on calculation rules in the embodiment, only the longest distance and/or the shortest distance or all distances, or any other number of distances may be calculated as geometric characteristics of the entity. Thus, an identifier formed by the means of geometric characteristics may be based on different numbers of distances, depending on the entity's shape.

FIG. 5 illustrates how the identifier of an entity can be used for illustrating amendments made to a model according to an embodiment in which identifiers stored in a run-time database, i.e. in random access memory, are also stored in a non-volatile memory. The reading process may continue, or a separate process may be initiated, to find out amendments made to the model (or to show changed entities). An advantage of the embodiment is that the designer does not need to himself/herself compare a present drawing with previous drawings, or to remember information on amendments made, passed in a person-to-person discussion or via email.

Referring to FIG. 5, identifiers formed by means of geometric characteristics of entities in the updated transfer file are compared in step 501 with identifiers of entities already stored in the model. If in the updated transfer file there is an entity whose identifier is the same as a previously stored identifier (step 502), the entity has not been changed (step 503) and all information associated with the identifier is maintained. If in the updated transfer file there is an entity whose identifier cannot be found in previously stored identifiers (step 504), the entity is regarded (step 505) as a new entity. If an identifier corresponding to a previously stored identifier cannot be found in the updated file ("no" in steps 502 and 504), the entity is regarded (step 507) as a deleted entity. When the identifiers, both the previously stored and those formed by means of geometric characteristics calculated from entities in the updated file, have been processed, the changes (preferably including new entities and deleted entities) are shown to a designer. It should be understood that if an entity changes, it may be regarded both as a new one and as a deleted one. In that case, information relating to the entity and stored in the model is lost, but since the entity has changed, by re-entering the information, the designer is "checking" that the information is correct one.

In another embodiment, only new entities are shown as changes, and in a further embodiment the changes are shown when detected.

FIG. 6 illustrates an embodiment in a situation in which a designer adds reference information to entities in a transfer data (reference model) read into the model. The designer selects (step 601) an entity shown on the user interface, and the system detects in step 601 the selection and opens a dialog window in step 602, the dialog window having the identifier formed by means of the geometric characteristics of the entity. Then the designer adds, in step 603, some information, such as an attribute, describing information related to the name and/or schedule (e.g. when the entity is to be manufactured or installed), to the dialog window, and indicates that he/she wants to store the added information. In response to the indication, the information is stored, in step 604, in association with the identifier. The advantage of this embodiment is that the designer can use the entity in a similar way as if it had been created by the designer, since the associated information endures in the model as long as the entity remains unchanged. An example of such a situation is that a structural engineer reads the architect's model as a reference model into the structural engineer's model, the reference model containing a column (a pillar). In response to detecting the column, geometric characteristics are calculated and stored in the column as described above. Then the structural engineer schedules an installation date for the column, the date being stored in association with the identifier formed by means of the geometric characteristics, thereby actually storing an installation date for the column. In case the architect's model changes and the changed model is reread into the structural engineer's model, unchanged columns are recognized because their geometrical characteristics have remained the same. Therefore an installation date of an unchanged column endures, and only if the column has changed, an installation date needs to be entered. In prior art solutions having no identifier with which additional information may be associated with, after rereading no installation date is available and the structural engineer needs to enter installation dates also for an unchanged column.

Another example is that a structural engineer reads the architect's model into the structural engineer's model as a reference model, the reference model containing a column. The structural engineer designs a beam supported by the column. Thanks to the identifier formed by means of the geometrical characteristics of the column, the beam may linked to the column, or more precisely to its identifier, and thereby stored, so that only if the architect changes the column, the structural engineer needs to redesign the beam. In prior art solutions, each time there is a change in the architect's model, the structural engineer needs to design the beam regardless whether or not the column changes, since there is no mechanism linking the beam with the column.

In one embodiment of the invention, identifiers formed by means of the geometric characteristics are stored in a volatile memory, such as a run-time database, and only in response to some information associated with the entity, the corresponding identifier with the associated information is stored in a non-volatile memory. The embodiment has an advantage that it smoothes processing of the model since identifiers of entities whose changes are irrelevant to the model are not stored, thereby minimizing the storage size of the model.

The steps shown in FIGS. 2, 4, 5 and 6 are not in an absolutely chronological order, and they may be executed in a different order than given here, or simultaneously. Other functions may be carried out between the described steps or simultaneously with them. It is also possible to leave out some of the steps shown in the Figures or to replace some of the described steps by a step that produces a corresponding end result.

It will be obvious to a person skilled in the art that, as the technology advances, the inventive concept can be implemented in various ways. The invention and its embodiments are not limited to the examples described above but may vary within the scope of the claims.

The invention claimed is:

1. A method of identifying an entity created using a first file format in a model created using a second file format, the method comprising:
    reading data in the first file format into the model in the second file format;
    recognizing an entity in the data read;
    calculating geometric characteristics of the entity;
    forming an identifier for the entity by the means of the calculated geometric characteristics; and
    storing the identifier in the model to be used for identifying the entity.

2. A method as claimed in claim 1, wherein the calculating geometric characteristics include:
    calculating a geometric center of the entity, and
    calculating maximum distances of the entity from the geometric center in predetermined directions.

3. A method as claimed in claim 2, wherein the model is a three-dimensional model, and the method further comprises:
    placing a unit cube in the entity so that a center of the unit cube is in the geometric center of the entity; and
    determining the directions from the center of the unit cube to each corner of the unit cube.

4. A method as claimed claim 1, the method further comprising:
    checking prior to storing the identifier whether or not the identifier is already stored in the model; and
    if not, storing the identifier in the model.

5. A method as claimed in claim 4, the method further comprising:
    checking for each identifier already stored whether or not a corresponding identifier is formed using the data;

and if not, interpreting that an entity corresponding to the identifier is deleted from the model.

6. A method as claimed in claim 4, further comprising:
using the outcome of the checking to indicate what has and what has not changed in the data.

7. A method as claimed in claim 1, the method further comprising:
adding information relating to an entity during modeling the model; and
storing the information in association with the identifier formed for the entity.

8. A method as claimed in claim 1, the method further comprising:
storing the identifier in a volatile memory;
adding information relating to an entity during modeling the model; and
storing the identifier in a non-volatile memory only if information relating to an entity corresponding to the identifier is added, the identifier being stored in association with the added information.

9. A computer program product embodied in a device-readable medium and comprising program instructions, wherein execution of the program instructions causes an apparatus containing the computer program product to perform:
calculating geometric characteristics of an entity in a first file format being read into a model in a second file format;
forming an identifier for the entity by the means of the calculated geometric characteristics; and
storing the identifier in the model to be used for identifying the entity.

10. A computer program product as claimed in claim 9, wherein the calculating geometric characteristics includes:
calculating a geometric center of the entity, and
calculating maximum distances of the entity from the geometric center in predetermined directions.

11. A computer program product as claimed in claim 10, wherein the model is a three-dimensional model, and the program product further causes the apparatus to perform:
placing a unit cube in the entity so that a center of the unit cube is in the geometric center of the entity; and
determining the directions from the center of the unit cube to each corner of the unit cube.

12. A computer program product as claimed in claim 10, the program product further causing the apparatus to perform:
enabling adding information relating to an entity during modeling the model; and
storing added information in association with the identifier formed for the entity.

13. A computer program product as claimed in claim 10, the program product further causing the apparatus to perform:
storing the identifier in a volatile memory; and
storing the identifier in a non-volatile memory only if information relating to an entity corresponding to the identifier is added, the identifier being stored in association with the added information.

14. An apparatus comprising:
at least one processor; and
at least one memory including computer code, wherein,
the at least one memory and the computer program code are configured to, with the at least one processor, cause the apparatus at least to:
model objects using a first file format;
read data in a second file format;
detect an entity in the data read in the second format;
calculate geometric characteristics for the entity detected in the data read in the second file format;
use the calculated geometric characteristics to form an identifier for an entity, the identifier identifying the entity in the first file format; and
store the identifier in the memory.

15. An apparatus as claimed in claim 14, wherein the at least one memory and the computer program code are configured to, with the at least one processor, cause the apparatus at least to calculate a geometric center of the entity, and maximum distances of the entity from the geometric center in predetermined directions.

16. An apparatus as claimed in claim 14, wherein the at least one memory and the computer program code are further configured to, with the at least one processor, cause the apparatus at least to check whether or not the identifier is already stored in the model; and to store a non-stored identifier in the model.

17. An apparatus as claimed in claim 14, wherein the at least one memory and the computer program code are further configured to, with the at least one processor, cause the apparatus to store information relating to the entity in association with the identifier.

18. An apparatus as claimed in claim 14,
wherein the at least one memory and the computer program code are further configured to, with the at least one processor, detect, in response to reading updated data in the second file format, changes made to the data by comparing identifiers of the updated data with the stored identifiers; and
the apparatus further comprising a user interface configured to indicate changes made to the data.

* * * * *